US009635773B1

(12) United States Patent
Marshall

(10) Patent No.: US 9,635,773 B1
(45) Date of Patent: Apr. 25, 2017

(54) POWER SUPPLY SYSTEM WITH A STABILIZED HOUSING

(71) Applicant: Sean Marshall, Las Vegas, NV (US)

(72) Inventor: Sean Marshall, Las Vegas, NV (US)

( * ) Notice: Subject to any disclaimer, the term of this patent is extended or adjusted under 35 U.S.C. 154(b) by 92 days.

(21) Appl. No.: 14/681,603

(22) Filed: Apr. 8, 2015

Related U.S. Application Data

(60) Provisional application No. 61/976,607, filed on Apr. 8, 2014.

(51) Int. Cl.
*H01H 9/02* (2006.01)
*H05K 5/02* (2006.01)
*H01R 13/70* (2006.01)

(52) U.S. Cl.
CPC ........... *H05K 5/0234* (2013.01); *H01R 13/70* (2013.01)

(58) Field of Classification Search
CPC .......... H02G 3/08; H02G 3/081; H02G 3/185; H05K 5/00; H05K 5/02; H05K 5/0234; H01R 25/003; H01R 25/006; H01R 13/70; H01H 9/02; H01H 9/06
USPC ....... 174/480, 481, 50, 53, 57, 58, 482, 494, 174/535, 54, 135; 220/3.2–3.9, 4.02; 248/906; 439/535, 654
See application file for complete search history.

(56) References Cited

U.S. PATENT DOCUMENTS 3,049,688 A * 8/1962 Sinopoli .............. H01R 25/006 174/58
5,903,869 A * 5/1999 Jacobson ............. A47G 29/122 248/205.3
6,200,159 B1 * 3/2001 Chou ................... H01R 25/003 174/494
6,875,051 B2 * 4/2005 Pizak ..................... H01R 27/02 439/535
6,897,379 B1 * 5/2005 Hsiao ................... H01H 9/0214 174/480
7,112,097 B1 * 9/2006 Lam ..................... H01R 25/003 439/654
7,442,090 B2 * 10/2008 Mori .................... H01R 25/003 174/53
7,626,119 B2 * 12/2009 Axland ................ H01R 25/006 174/135
8,193,658 B2 * 6/2012 Fleisig ................. H01R 25/003 174/493

* cited by examiner

*Primary Examiner* — Angel R Estrada
(74) *Attorney, Agent, or Firm* — Nguyen & Tarbet Patent Law Firm

(57) ABSTRACT

A power supply system for powering multiple external electrical devices. The power supply system has a housing with at least one outlet for receiving an electrical plug, a weight disposed inside the housing, and a gripping component disposed on an outer surface of a base of the housing. A power cord may be operatively connected to the outlet for supplying electrical power to the outlet. The weight provides stability to the housing and the gripping component secures the housing to an external surface when the power supply system is placed upon the external surface. The housing may further have at least one universal serial bus (USB) port and an On/Off switch for controlling input of electrical power.

15 Claims, 5 Drawing Sheets

POWER SUPPLY SYSTEM WITH A STABILIZED HOUSING

CROSS REFERENCE

This application claims priority to U.S. Provisional Patent Application No. 61/976,607, filed Apr. 8, 2014, the specification(s) of which is/are incorporated herein in their entirety by reference.

FIELD OF THE INVENTION

The present invention relates to a power supply system, in particular, a power board having a weighted housing and gripping components for providing stability and preventing the power board from moving from a surface.

BACKGROUND OF THE INVENTION

Extensions of outlets, such as power strips, extension cords, and power boards, are convenient for providing electricity at locations where a power source in not available. Moreover, these power supplying systems can allow for multiple devices to be plugged into the systems. One problem with these power supply systems is that they can be moved out of place. For example, when one device is removed from an outlet of the system, another device may be unintentionally unplugged. Hence, there is a need for a more stable power supply system that can resist movement when it is placed on top of a surface.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

SUMMARY OF THE INVENTION

The present invention features a power supply system for powering multiple external electrical devices. In some embodiments, the power supply system comprises a housing comprising at least one outlet for receiving an electrical plug, a weight disposed inside the housing, and a gripping component disposed on an outer surface of a base of the housing. In some embodiments, the power supply system further comprises a power cord coupled to the outlet for supplying electrical power to the outlet. The weight provides stability to the housing and the gripping component secures the housing to an external surface when the power supply system is placed upon the external surface. In some embodiments, the housing further comprises an On/Off switch for controlling input of electrical power. The On/Off switch may comprise a visual indicator. In some embodiments, the housing further comprises at least one universal serial bus (USB) port.

DESCRIPTION OF PREFERRED EMBODIMENTS

Figure 1:
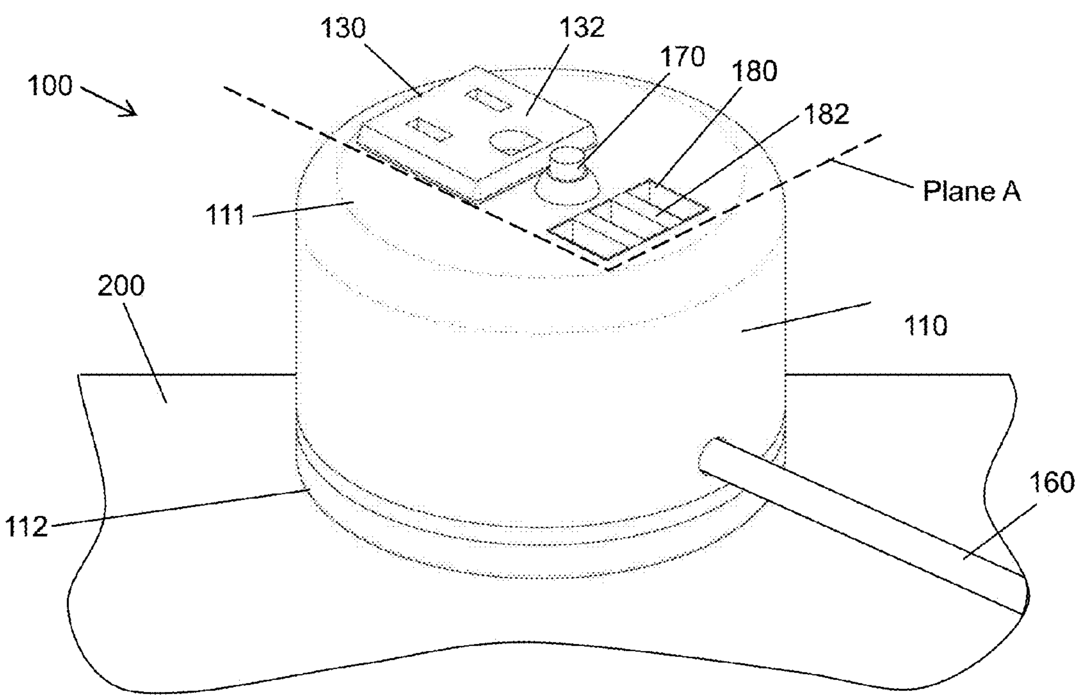
FIG. 1 shows a perspective view of an embodiment of the present invention.
Figure 2:
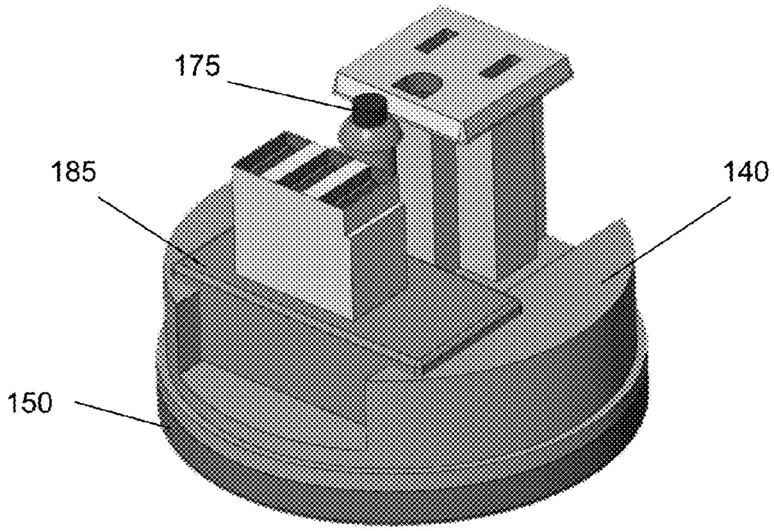
FIG. 2 shows an internal view of an embodiment of the present invention.

Following is a list of elements corresponding to a particular element referred to herein:

100 power supply system
110 housing
112 base
115 outer surface
117 perimeter
130 outlet
140 weight
142 indentation
144 top surface of the weight
150 gripping component
160 power cord
170 On/Off switch
175 LED
180 USB port
185 transformer
200 external surface Referring now to FIG. 1-10, the present invention features a power supply system (100) for powering multiple external electrical devices. In some embodiments, the power supply system (100) comprises a housing (110) comprising at least one outlet (130) for receiving an electrical plug. In some embodiments, a weight (140) disposed inside the housing (110). The weight (140) may be dispose at or near a base (112) of the housing (110) such that a centre of mass of the system (100) is located at or near the base (112). In some embodiments, the power supply system (100) further comprises a power cord (160) for receiving an input of electricity thereby supplying electrical power to the system (100). In some embodiments, the outlet (130) is operatively connected to the power cord (160).

Figure 3:
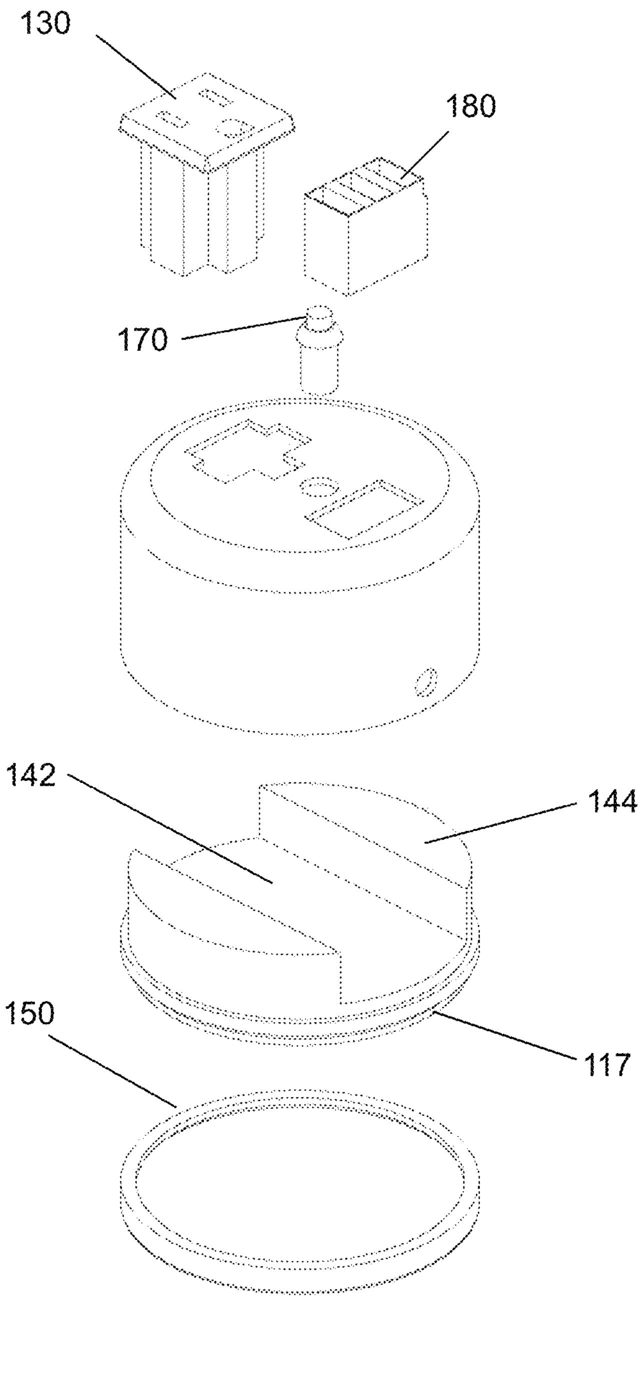
FIG. 3 shows an exploded view of an embodiment of the present invention.
Figure 4:
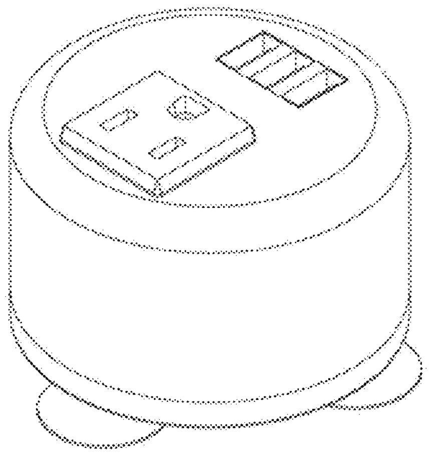
FIG. 4 shows a perspective view of an embodiment of the present invention.
Figure 5:
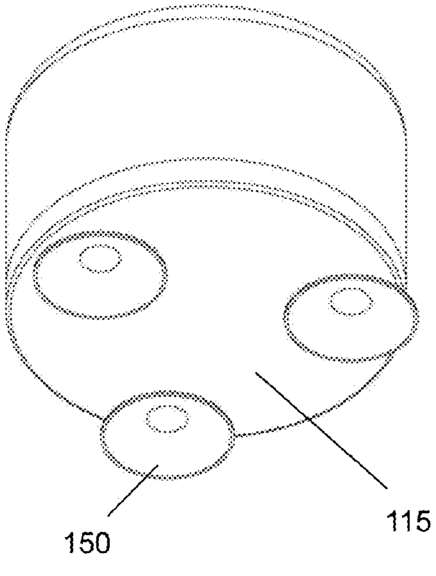
FIG. 5 shows a bottom view of an embodiment of the present invention.
Figure 6:
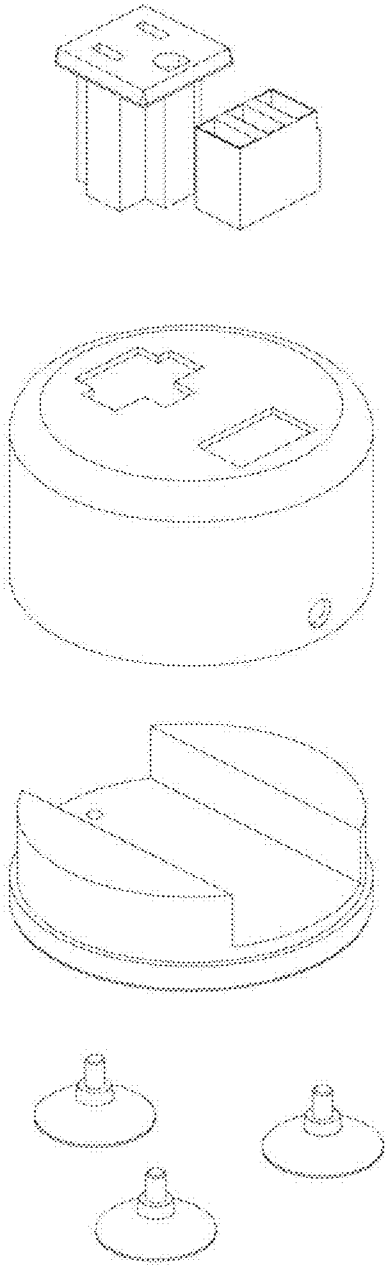
FIG. 6 an exploded view of an embodiment of the present invention.
Figure 7:
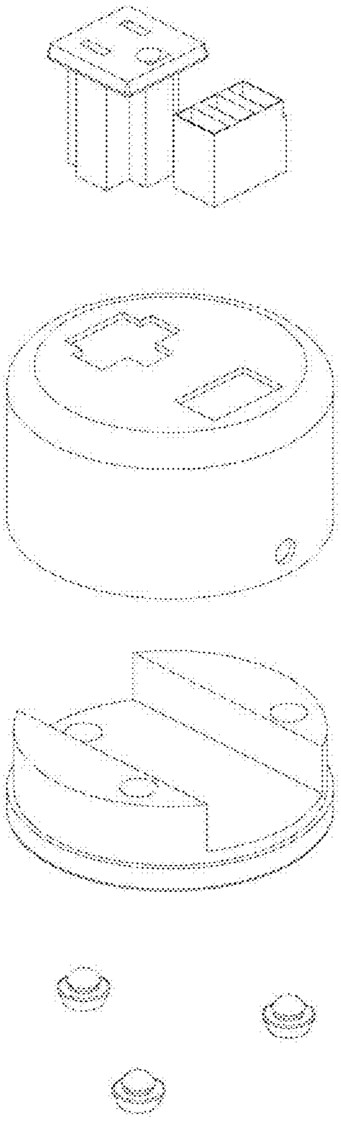
FIG. 7 an exploded view of an embodiment of the present invention.
Figure 8:
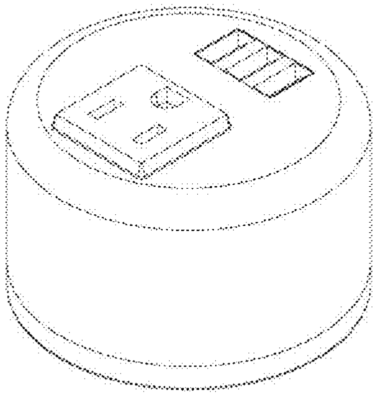
FIG. 8 shows a perspective view of an embodiment of the present invention.
Figure 9:
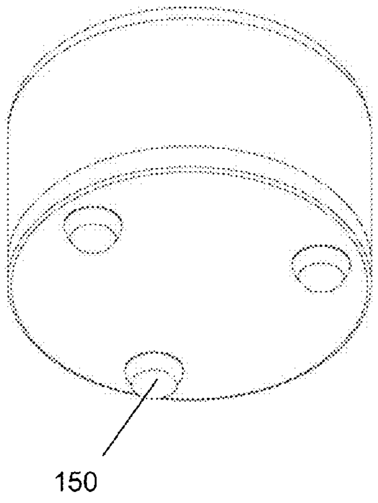
FIG. 9 shows a bottom view of an embodiment of the present invention.
Figure 10A:
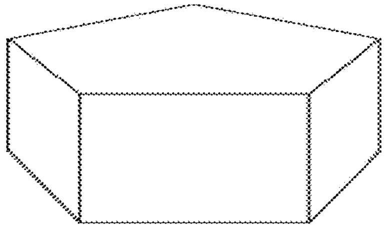
FIG. 10*a*-10*j* show alternative embodiments of the present invention.
Figure 10B:
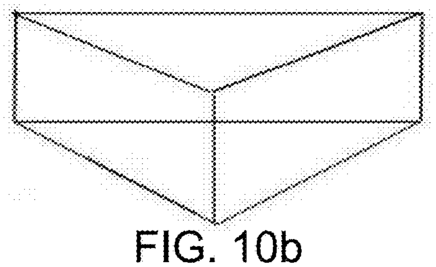
Figure 10C:
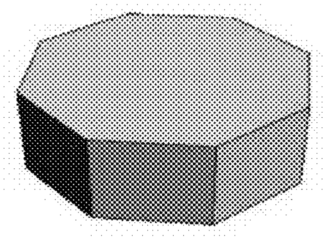
Figure 10D:
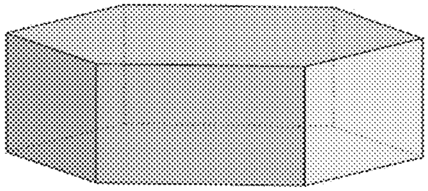
Figure 10E:
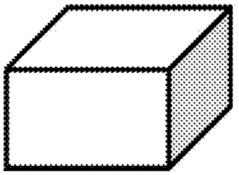
Figure 10F:
Figure 10G:
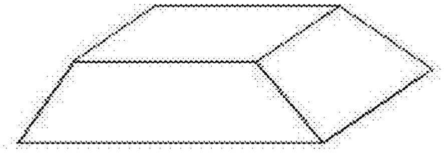
Figure 10H:
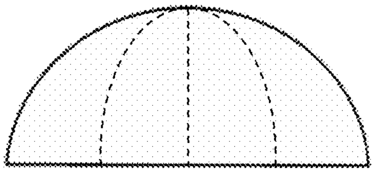
Figure 10I:
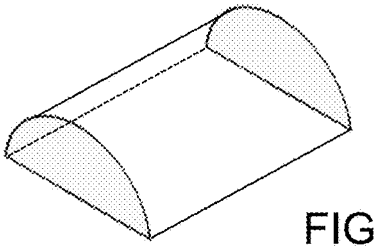
Figure 10J:
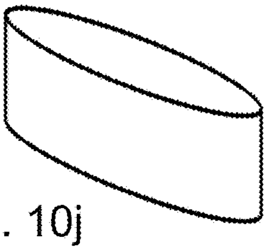

As shown in FIG. 3, the weight may have an indentation (142) disposed on a top surface (144) of the weight (140) for accommodating the outlet (130). In some embodiments, the weight (140) provides stability to the housing (110) when the power supply system (100) is placed upon an external surface (200). In some embodiments, the power supply system (100) further comprises a gripping component (150) disposed on an outer surface (115) of the base (112) of the housing (110). The gripping component (150) secures the housing (110) to the external surface (200) when the power supply system (100) is placed upon the external surface (200).

In some embodiments, the housing (110) further comprises an On/Off switch (170) for controlling input of electrical power to the outlet (130). The On/Off switch (170) may comprise a light emitting diode (LED) (175) for providing a visual indication of when the outlet (130) is activated. The LED is operatively connected to the On/Off switch, and the On/Off switch is operatively connected to the power cord (160). In some embodiments, the On/Off switch (170) is a push button.

In some embodiments, the housing (110) further comprises at least one universal serial bus (USB) port (180). The USB port (180) may be operatively connected to a transformer (185) disposed inside the housing (110). The transformer (185) may be operatively connected to the power cord (160). As known to one skilled in the art, the transformer (185) transforms electrical power supplied by the power cord (160) to a voltage suitable for distribution through the USB port (180).

In some embodiments, the housing (110) further comprises an On/Off switch (170) for controlling input of electrical power to the outlet (130) and the USB port (180). The On/Off switch (170) is operatively connected to the power cord (160). In some embodiments, the On/Off switch (170) may comprise a light emitting diode (LED) (175) for providing a visual indication of when the outlet (130) or the USB port (180) is activated. The LED (175) is operatively connected to the On/Off switch (170). In other embodiments, the On/Off switch (170) may comprise a display screen for providing a visual indication of when the outlet (130) or the USB port (180) is activated. The display screen is operatively connected to the On/Off switch (170). In still other embodiments, the On/Off switch (170) may comprise an On switch and a separate Off switch. In some embodiments, the On/Off switch (170) is a push button.

In some embodiments, the weight (140) is constructed from metal or a high density polymer. The weight (140) may be positioned at the base (112). The weight (140) helps to keep the housing stable, e.g., by helping to prevent tilting or sliding. In some embodiments, the weight (140) is evenly distributed around the base (112). In other embodiments, the weight (140) is centered in the center area of the base (112). In still other embodiments, the weight (140) is distributed (e.g., evenly) around the outer edges of the base (112). In still other embodiments, the weight (140) is distributed at opposing sides of the base (112).

In some embodiments, the gripping component (150) is disposed on a perimeter (117), or outer edges, of the outer surface (115). In some embodiments, the gripping component (150) covers at least a portion of the outer surface (115). The gripping component (150) helps the housing (110) maintain contact with the external surface (200) on which it is placed (e.g., desk, table). The gripping component (150) helps prevent the housing (110) from moving around on the external surface (200). In some embodiments, the gripping component (150) comprises a tacky substance. In other embodiments, the gripping component (150) is constructed from rubber, latex, silicone, vinyl, anti-slip fabric, or a combination thereof. In still other embodiments, the gripping component (150) is constructed from any other suitable material capable of securing the housing (110) to a surface (200). In some other embodiments, the gripping component (150) comprises one or more suction cups or one or more bumpers. In other embodiments, the gripping component (150) may be of any other suitable form.

As shown in FIG. 1, the housing (110) is cylindrical in shape. In some embodiments, the housing (110) may be of any shape as shown in FIGS. 10*a* to 10*j*, or cuboidal in shape. For example, the housing (110) may be in the shape of a prism or a dome. The housing (110) may be constructed in a variety of any other suitable shapes and is not limited to the aforementioned shapes.

In some embodiments, the system (100) of the present invention can be used atop a surface such as a desk or table; however, the system (100) is not limited to use atop a surface.

The power cord (160) is operatively connected to the outlet (130) and USB ports (180). The power cord (160) may have a male plug at one end of the power cord (160) that can be plugged into a wall outlet and serves to provide power to the outlet (130) and USB ports (180).

In some embodiments, the system (100) comprises one outlet (130). In other embodiments, the system (100) comprises two outlets (130). In some embodiments, the system (100) comprises three outlets (130). In other embodiments, the system (100) comprises four outlets (130). In some embodiments, the system (100) comprises five outlets (130). In other embodiments, the system (100) comprises more than five electrical outlets (130). In some embodiments, the outlets (130) are arranged symmetrically on the top surface of the housing (110). In other embodiments, the outlets (130) are arranged asymmetrically on the top surface of the housing (110). In some embodiments, the outlets (130) are arranged on the side surface of the housing (110).

In some embodiments, the outlet (130) may be of any type selected from a group consisting of a Type A outlet, a Type B outlet, a Type C outlet, a Type D outlet, a Type E outlet, a Type F outlet, a Type G outlet, a Type H outlet, a Type I outlet, a Type J outlet, a Type K outlet, a Type L outlet, a Type M outlet, a Type N outlet, or Type O outlet. In a plurality of outlets (130), the outlets (130) may be in any combination of types. For example, the plurality of outlets (130) may be all of the same type. In another example, each outlet may be of a different type, such as the first outlet is a Type A and the second outlet is a Type B.

In some embodiments, the system (100) comprises one USB port (180). In other embodiments, the system (100) comprises two USB ports (180). In some embodiments, the system (100) comprises three USB ports (180). In other embodiments, the system (100) comprises four USB ports (180). In some embodiments, the system (100) comprises five USB ports (180). In other embodiments, the system (100) comprises more than five USB ports (180). In some embodiments, the USB ports (180) are arranged symmetrically on the top surface of the housing (110). In other embodiments, the USB ports (180) are arranged asymmetrically on the top surface of the housing (110). In some embodiments, the USB ports (180) are arranged on the side surface of the housing (110).

The power supply system (100) of the present invention may be constructed in a variety of sizes. For example, in some embodiments, the housing (110) is about 3 inches in diameter, 3 inches in length, 3 inches in width, or 3 inches in height. In some embodiments, the housing (110) is between about 2 to 4 inches in diameter. In other embodiments, the housing (110) is between about 3 to 5 inches in diameter. In some embodiments, the housing (110) is between about 4 to 6 inches in diameter. In other embodiments, the housing (110) is between about 5 to 7 inches in diameter. In some embodiments, the housing (110) is between about 6 to 8 inches in diameter. In other embodiments, the housing (110) is more than about 8 inches in diameter. The present invention may be of any suitable dimensions, and is not limited to the aforementioned sizes.

One embodiment of the present invention may feature a power supply system (100) comprising a housing (110), a weight (140), a gripping component (150), and a power cord (160). The housing (110) may comprise at least one outlet (130) for receiving an electrical plug, a plurality of universal serial bus (USB) ports (180), and an On/Off switch (170) for controlling input of electrical power to the outlet (130) and the USB ports (180). The USB ports (180) are operatively connected to a transformer (185) disposed inside the housing (110). The On/Off switch (170) comprises a light emitting diode (LED) (175) for providing a visual indication of when the outlet (130) or the USB ports (180) are activated. The LED (175) is operatively connected to the On/Off switch (170). The On/Off switch (170) is a push button. The weight (140) may be disposed inside the housing (110) and at or near a base (112) of the housing (110) such that a centre of mass of the system (100) is located at or near the base (112). The weight (140) has an indentation (142) disposed on a top surface (144) of the weight (140) for accommodating the outlet (130) and the USB ports (180). A gripping component (150) is disposed on an outer surface (115) of the base (112) of the housing (110). The power cord (160) receives an input of electricity, thereby supplying electrical power to the system (100). The power cord (160) is operatively connected to the outlet (130) and the transformer (185). The transformer (185) transforms electrical power supplied by the power cord (160) to a voltage suitable for distribution through each USB port (180). The weight (140) provides stability to the base (112) of the housing (110), and the gripping component (150) secures the housing (110) to an external surface (200) when the power supply system (100) is placed upon the external surface (200).

As used herein, the term "about" refers to plus or minus 10% of the referenced number.

Various modifications of the invention, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. Reference numbers recited in the claims are exemplary and for ease of review by the patent office only, and are not limiting in any way. In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting of", and as such the written description requirement for claiming one or more embodiments of the present invention using the phrase "consisting of" is met.

The reference numbers recited in the below claims are solely for ease of examination of this patent application, and are exemplary, and are not intended in any way to limit the scope of the claims to the particular features having the corresponding reference numbers in the drawings.

What is claimed is:

1. A power supply system (100) for powering multiple external electrical devices, said power supply system (100) comprising:

a. a housing (110) comprising:

i. at least one outlet (130) for receiving an electrical plug, wherein a socket face (132) of the outlet is disposed on a top surface (111) of the housing; and ii. at least one universal serial bus (USB) port (180), wherein a port face (182) of the USB port is disposed on the top surface (111) of the housing;

b. a weight (140) disposed inside the housing (110), wherein the weight (140) is dispose at a base (112) of the housing (110) such that a centre of mass of the system (100) is located at or near the base (112), wherein the weight (140) has an indentation (142) disposed on a top surface (144) of the weight (140) for accommodating the outlet (130) and the USB port (180); and c. a power cord (160) for receiving an input of electricity thereby supplying electrical power to the system (100);

wherein the outlet (130) is operatively connected to the power cord (160), wherein the USB port (180) is operatively connected to a transformer (185) disposed inside the housing (110), wherein the transformer (185) is operatively connected to the power cord (160), wherein the transformer (185) transforms electrical power supplied by the power cord (160) to a voltage suitable for distribution through the USB port (180), wherein the weight (140) is disposed at the base (112) to provide stability to the housing (110) when the power supply system (100) is placed upon an external surface (200), wherein the socket face (132) and the port face (182) are disposed on the top surface (111) of the housing such that they lie on a plane, Plane A, that is parallel to the external surface (200).

2. The power supply system (100) of claim 1, wherein the housing (110) further comprises an On/Off switch (170) for controlling input of electrical power to the system (100), wherein the On/Off switch (170) is disposed on the top surface (111) of the housing, wherein the On/Off switch (170) comprises a light emitting diode (LED) (175) for providing a visual indication of when the system (100) is activated, wherein the LED is operatively connected to the On/Off switch (170), and wherein the On/Off switch (170) is operatively connected to the power cord (160).

3. The power supply system (100) of claim 2, wherein the On/Off switch (170) is a push button.

4. The power supply system (100) of claim 1 further comprising a gripping component (150) disposed on an outer surface (115) of the base (112) of the housing (110), wherein the gripping component (150) secures the housing (110) to the external surface (200) when the power supply system (100) is placed upon the external surface (200).

5. The power supply system (100) of claim 4, wherein the gripping component (150) comprises a tacky substance.

6. The power supply system (100) of claim 4, wherein the gripping component (150) is constructed from rubber, latex, silicone, vinyl, anti-slip fabric, or a combination thereof.

7. The power supply system (100) of claim 4, wherein the gripping component (150) comprises one or more suction cups.

8. The power supply system (100) of claim 4, wherein the gripping component (150) comprises one or more bumpers.

9. The power supply system (100) of claim 4, wherein the gripping component (150) is disposed on a perimeter (117) of the outer surface (115).

10. The power supply system (100) of claim 4, wherein the gripping component (150) covers at least a portion of the outer surface (115).

11. The power supply system (100) of claim 1, wherein the weight (140) is constructed from metal or a high density polymer.

12. The power supply system (100) of claim 1, wherein the housing (110) is cylindrical in shape.

13. The power supply system (100) of claim 1, wherein the housing (110) is cuboidal in shape.

14. A power supply system (100) for powering multiple external electrical devices, said power supply system (100) comprising:

a. a housing (110) comprising:
  i. at least one outlet (130) for receiving an electrical plug, wherein a socket face (132) of the outlet is disposed on a top surface (111) of the housing;
  ii. a plurality of universal serial bus (USB) ports (180), wherein the USB ports (180) are operatively connected to a transformer (185) disposed inside the housing (110), wherein a port face (182) of the USB ports is disposed on the top surface (111) of the housing; and
  iii. an On/Off switch (170) for controlling input of electrical power to the outlet (130) and the USB ports (180), wherein the On/Off switch (170) is disposed on the top surface (111) of the housing, wherein the On/Off switch (170) comprises a light emitting diode (LED) (175) for providing a visual indication of when the outlet (130) or the USB ports (180) are activated, wherein the LED (175) is operatively connected to the On/Off switch (170), wherein the On/Off switch (170) is a push button;

b. a weight (140) disposed inside the housing (110), wherein the weight (140) is dispose at a base (112) of the housing (110) such that a centre of mass of the system (100) is located at or near the base (112), wherein the weight (140) has an indentation (142) disposed on a top surface (144) of the weight (140) for accommodating the outlet (130) and the USB ports (180);

c. a gripping component (150) disposed on an outer surface (115) of the base (112) of the housing (110); and d. a power cord (160) for receiving an input of electricity thereby supplying electrical power to the system (100), wherein the power cord (160) is operatively connected to the outlet (130) and the transformer (185);
  wherein the transformer (185) transforms electrical power supplied by the power cord (160) to a voltage suitable for distribution through each USB port (180),
  wherein the weight (140) is disposed at the base (112) to provide stability to the housing (110), and wherein the gripping component (150) secures the housing (110) to an external surface (200) when the power supply system (100) is placed upon the external surface (200),
  wherein the socket face (132) and the port face (182) are disposed on the top surface (111) of the housing such that they lie on a plane, Plane A, that is parallel to the external surface (200).

15. A power supply system (100) for powering multiple external electrical devices, said power supply system (100) consisting of:

a. a housing (110);

b. an outlet (130) for receiving an electrical plug, wherein the outlet (130) is disposed in the housing (110), wherein a socket face (132) of the outlet is disposed on a top surface (111) of the housing;

c. a plurality of universal serial bus (USB) ports (180) disposed in the housing (110), wherein a port face (182) of the USB ports is disposed on the top surface (111) of the housing, wherein the USB ports (180) are operatively connected to a transformer (185) disposed inside the housing (110);

d. an On/Off switch (170) for controlling input of electrical power to the outlet (130) and the USB ports (180), wherein the On/Off switch (170) is disposed on the top surface (111) of the housing, wherein the On/Off switch (170) is a push button consisting of a light emitting diode (LED) (175) operatively connected to the On/Off switch (170) for providing a visual indication of when the outlet (130) or the USB ports (180) are activated;

e. a weight (140) disposed inside the housing (110), wherein the weight (140) is dispose at a base (112) of the housing (110) such that a centre of mass of the system (100) is located at or near the base (112), wherein an indentation (142) is disposed on a top surface (144) of the weight (140) for accommodating the outlet (130) and the USB ports (180);

f. a gripping component (150) disposed on an outer surface (115) of the base (112) of the housing (110); and g. a power cord (160) for receiving an input of electricity thereby supplying electrical power to the system (100), wherein the power cord (160) is operatively connected to the outlet (130) and the transformer (185);
  wherein the transformer (185) transforms electrical power supplied by the power cord (160) to a voltage suitable for distribution through each USB port (180),
  wherein the weight (140) is disposed at the base (112) to provide stability to the housing (110), and wherein the gripping component (150) secures the housing (110) to an external surface (200) when the power supply system (100) is placed upon the external surface (200),
  wherein the socket face (132) and the port face (182) are disposed on the top surface (111) of the housing such that they lie on a plane, Plane A, that is parallel to the external surface (200).

* * * * *